United States Patent [19]
Demler

[11] Patent Number: 5,148,054
[45] Date of Patent: Sep. 15, 1992

[54] HIGH ACCURACY MOSFET-SWITCHED SAMPLING CIRCUIT

[75] Inventor: Michael J. Demler, Mansfield, Mass.

[73] Assignee: Unitrode Corporation, Billerica, Mass.

[21] Appl. No.: 741,549

[22] Filed: Aug. 7, 1991

[51] Int. Cl.[5] .................... H03K 17/16; H03K 17/687
[52] U.S. Cl. .................................. 307/352; 307/355; 307/491; 307/572
[58] Field of Search ............... 307/572, 491, 355, 356, 307/350, 362, 352, 353

[56] References Cited

U.S. PATENT DOCUMENTS

| | | | |
|---|---|---|---|
| 3,586,880 | 6/1971 | Fitzwater, Jr. | 307/572 |
| 4,075,509 | 2/1978 | Redfern | 307/355 |
| 4,323,796 | 4/1982 | Lathrope | 307/353 |
| 4,461,965 | 7/1984 | Chin | 307/355 |
| 4,691,125 | 9/1987 | Rybicki | 307/353 |
| 4,922,130 | 5/1990 | Swerlein | 307/353 |

FOREIGN PATENT DOCUMENTS 0086908  5/1985  Japan .................... 307/355

OTHER PUBLICATIONS

C. Eichenberger and W. Guggenbühl, "Dummy Transistor Compensation of Analog MOS Switches", IEEE Journal of Solid State Circuits vol. 24, No. 4 pp. 1143-1145 (Aug. 1989).

R. E. Suarez and P. R. Gray, "All-MOS Charge Redistribution Analog-to-Digital Conversion Techniques-Part II", IEEE Journal of Solid State Circuits vol. SC-10, pp. 379-385, (Dec. 1975).

*Primary Examiner*—John Zazworsky
*Attorney, Agent, or Firm*—Weingarten, Schurgin, Gagnebin & Hayes

[57] ABSTRACT

A high-accuracy MOSFET-switched sampling circuit feeds charge feedthrough error to a load as well as to a dummy load during DC input signal sampling by a switching MOSFET, thereby reducing storage of the charge feedthrough error on the load to the extent that the charge feedthrough error is rather stored on the dummy load. During AC input signal sampling, the high-accuracy MOSFET-switched sampling circuit isolates the AC input signal from the dummy load. Charge feedthrough error produced by an isolating MOSFET that isolates the AC input signal from the dummy load is exactly compensated by a phase-opposed compensating MOSFET positioned in the DC input signal path. The dummy load and the load may be active as well as passive and may be selected to have equal and unequal electrical characteristics. The compensating current produced by the compensating MOSFET may be selected not only to exactly compensate the charge feedthrough error of the isolating MOSFET but also to compensate the charge feedthrough error of the switching MOSFET in the DC input signal path. High sampling accuracies are achieved by the instant invention in a wide variety of applications including an exemplary auto-zeroed CMOS comparator.

20 Claims, 3 Drawing Sheets

HIGH ACCURACY MOSFET-SWITCHED SAMPLING CIRCUIT

FIELD OF THE INVENTION

The present invention is directed to the field of electrical interconnection circuits, more particularly, to a high-accuracy MOSFET switching circuit for alternatively sampling a DC reference signal and an AC input signal to a load, and more particularly, to such a circuit where the load includes a capacitive load.

BACKGROUND OF THE INVENTION

Some CMOS (Complementary Metal-Oxide Semiconductor) (devices incorporate MOSFET's (Metal-Oxide-Semiconductor Field-Effect Transistors) to alternatively sample an AC input signal and a DC reference signal onto a common load. In such applications as switched-capacitor filters, auto-zeroed comparators and amplifiers, and analog-to-digital convertors, among others, a MOSFET switching transistor is provided in the DC input signal path and another MOSFET switching transistor is provided in the AC input signal path. The MOSFET switching transistor in the DC input signal path is switched in non-overlapping phase opposition to the MOSFET switching transistor provided in the AC input signal path in such a way as to controllably switch the DC input signal and the AC input signal alternatively to the same load. As a result of parasitic capacitances between both the gate to source and gate to drain terminals of the MOSFET switching transistor in the DC input signal path as well as charge in the source to drain channel of the MOSFET switching transistor in the DC input signal path, undesirable currents are produced as the MOSFET switching transistor in the DC input signal path is switched from its "on" to its "off" condition. The currents induced by the parasitic capacitances and channel charge corrupt the DC input signal sampled onto the load, placing thereby a limit on the accuracy with which the AC signal is able to be alternatively sampled to the same load.

To compensate the switching MOSFET in the DC input signal path for the unwanted currents, so-called "charge feedthrough error", it is known to provide a second, compensating MOSFET in the DC input signal path in series relation with the switching MOSFET thereof. The capacitance of the second, compensating MOSFET is selected to be equal to the parasitic capacitance exhibited by the gate to drain terminals of the MOSFET switching transistor in the DC input signal path to be compensated. The second, compensating MOSFET, switched in phase opposition to the MOSFET switching transistor to be compensated in the DC input signal path, produces a current of a sign that cancels out the charge feedthrough error of the MOSFET switching transistor to be compensated in the DC input signal path. So much as the magnitude of the unwanted currents attributable to both the gate to source parasitic capacitance and to the channel charge are negligible with respect to the unwanted current attributable to the gate to drain parasitic capacitance of the switching MOSFET to be compensated, just so much does the compensating MOSFET of the heretofore known charge feedthrough error compensation technique provide cancellation of the charge feedthrough error. But in many if not all practicable embodiments, the unwanted current attributable to the charge of the channel and the unwanted current attributable to the parasitic capacitance of the gate to source terminals of the MOSFET switching transistor to be compensated are often either commensurate with or greater than the current attributable to the parasitic capacitance of the gate to drain parasitic capacitance thereof, which currents, uncompensated by the heretofore known charge feedthrough error compensation technique, corrupt the sampling of the DC input signal to the load and thereby limit the accuracy with which the AC input signal is able to be sampled to the same load.

Other accuracy limiting factors in addition to the failure of the heretofore known charge feedthrough error compensation technique to cancel the unwanted currents attributable both to the channel charge and to the gate to source parasitic capacitance of the switching MOSFET in the DC input signal path are the electrical asymmetries that belong to the switching and compensating MOSFET transistors as they are switched in phase-opposition between their "on" and "off" conditions. Not only is the "on" capacitance not the same in magnitude as the "off" capacitance of the several transistors, so that the unwanted current attributable to the magnitude of the gate to drain parasitic capacitance of the switching MOSFET to be compensated really is not and cannot be precisely matched by the current attributable to the magnitude of the parasitic capacitance of the compensating MOSFET as the former is turned "off" and the latter "on", not only is the range of potential swing from the turn-off voltage to the off potential as one MOSFET is being turned to its "off" condition not the same in magnitude as the voltage swing from the turn-off voltage to the on potential of the other MOSFET as it is being turned to its "on" condition, so that the self-cancelling currents, due to the variation in the magnitude of the voltage swing across the parasitic capacitances of the phase-opposed switching and compensating MOSFETS, are not and cannot be precisely matched, but also it is practicably impossible to provide precisely-synchronized phase-opposed (or other relative phase) clocking signals. In addition, the phase-opposed switching of the switching and compensating MOSFETS gives rise to the asymmetry that the compensating MOSFET produces its cancelling current before the switching MOSFET to be compensated is fully in its "off" condition. The compensating current produced by the compensating MOSFET, instead of cancelling the charge feedthrough error by flowing to the load, rather flows out along the DC input signal path in such a way as to be dissipated by the input impedance thereof. While it is known that a phase delay may be interposed by which the switching and compensating MOSFETS are alternatively switched with an interval sufficient to enable the switching MOSFET to be fully turned to its "off" condition before the compensating MOSFET is turned to its "on" condition, the magnitude of the charge feedthrough error can nonetheless remain unsatisfactorily large.

SUMMARY OF THE INVENTION

It is accordingly the principal object of the present invention to provide a high-accuracy MOSFET-switched sampling circuit that exhibits a charge feedthrough error reduced by at least a factor of two over that of the heretofore known charge feedthrough error compensation technique. In accord therewith, first means are disclosed in the DC input signal path for feeding no more than one half of the charge feedthrough error of the switching MOSFET to the load, second means including an isolating MOSFET in the DC input signal path and cooperative with the first means are disclosed for electrically isolating the first means from the AC input signal path, and third means cooperative with the first and second means are disclosed for exactly compensating the charge feedthrough error introduced by the isolating MOSFET of the isolating means. In the preferred embodiment, the first means includes a dummy load in the DC input signal path that is electrically equivalent to and in electrically parallel relation with the load; the charge feedthrough error produced by the switching MOSFET in the DC input signal path is equally split between the dummy load and the load. In the preferred embodiment, the isolating MOSFET of the second means is provided in the DC input signal path in electrically serial relation between the dummy load and the load, and the second means includes means for switching the isolating MOSFET fully to the "off" condition thereof before the switching MOSFET in the AC input signal path is switched to the "on" condition thereof; the dummy load is thereby rendered transparent to the AC input signal path. In the preferred embodiment, the third means includes a compensating MOSFET having a preselected parasitic capacitance that is selected to exactly match the parasitic capacitance including channel charge of the isolating MOSFET of the second means. The compensating MOSFET exactly compensates both the currents attributable to the gate to drain parasitic capacitance as well as to the channel charge of the isolating MOSFET of the second means. In alternative embodiments, the load and the dummy load can be selected to be electrically unequal, so as to shift more (or less) of the charge feedthrough error into the dummy load than to the load, and the parasitic capacitance of the compensating MOSFET can be selected to compensate the unwanted currents produced both by the switching MOSFET and by the isolating MOSFET.

BRIEF DESCRIPTION OF THE DRAWINGS

Other objects, features and aspects of the present invention will become apparent to those skilled in the art as the invention becomes better understood by referring to the following exemplary and non-limiting detailed description of the preferred embodiments thereof, and to the drawings, wherein.

DETAILED DESCRIPTION OF THE PREFERRED EMBODIMENTS

Figure 1A:
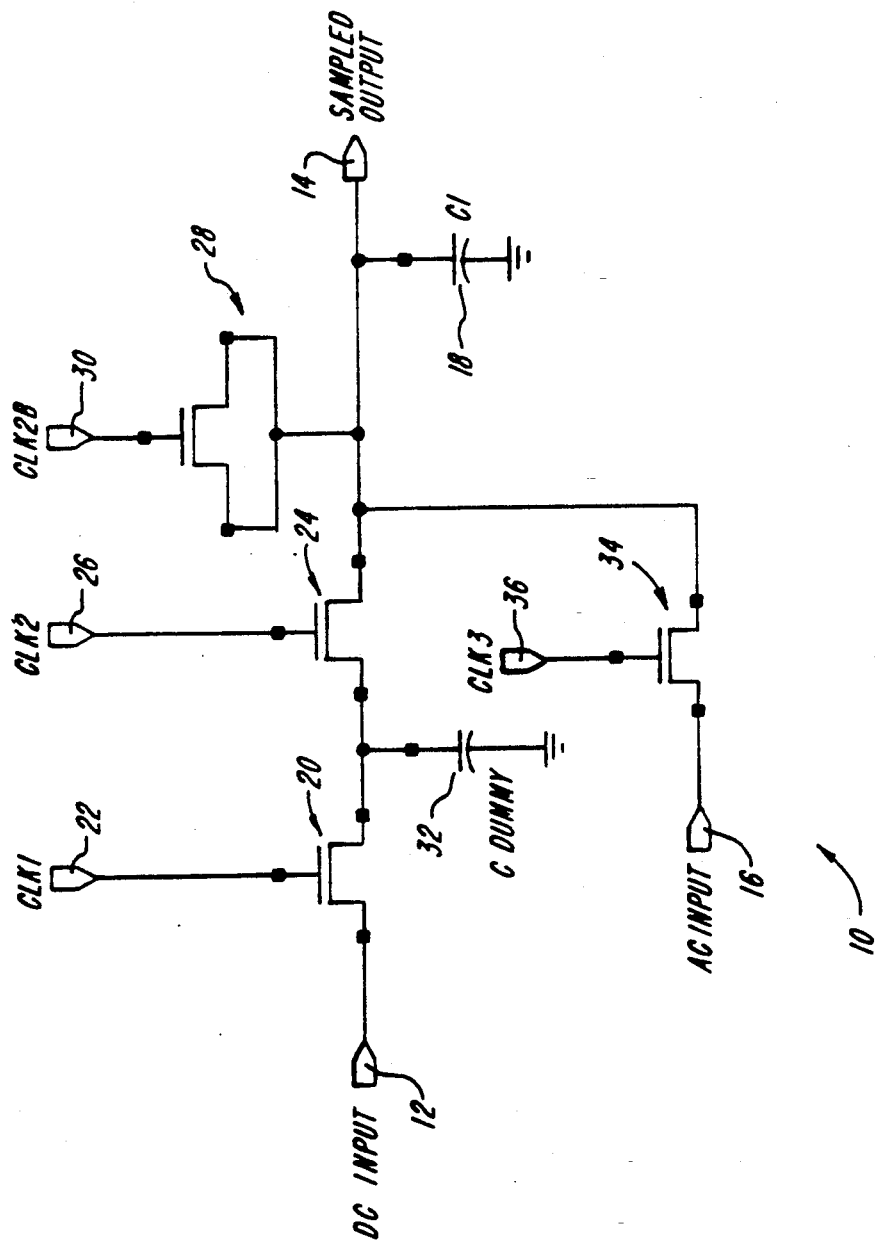
FIG. 1A illustrates a schematic diagram and in the FIG. 1B thereof a timing diagram of a high-accuracy MOSFET-switched sampling circuit in accord with the present invention.

Referring now to FIG. 1A, generally designated at 10 is a schematic diagram of a high-accuracy MOSFET-switched sampling circuit in accord with the present invention. The high-accuracy MOSFET-switched sampling circuit 10 includes a DC input circuit path defined between an input terminal 12 marked "DC input" and an output terminal 14 marked "sampled output", and an AC input signal path defined between an input terminal 16 marked "AC input" and the output terminal 14. The voltage available at the output terminal 14 is the same voltage as that produced on a load capacitor 18 marked "Cl".

A first MOSFET switching transistor generally designated 20 is provided in serial relation along the DC input signal path. The first MOSFET switching transistor 20 is switched between its "on" and its "off" conditions under control of a clock marked "clk1" applied to a terminal 22 that is electrically connected in series to the gate of the first MOSFET switching transistor 20. A second MOSFET isolating transistor generally designated 24 is connected with its source in series with the drain of the first MOSFET switching transistor 20 and with its drain electrically connected in series to the output terminal 14. The second MOSFET isolating transistor 24 is switched between its "on" and its "off" conditions under control of a clock signal marked "clk2" applied to its gate terminal 26. A third MOSFET compensating transistor generally designated 28 is serially coupled in the DC input signal path between the drain of the second MOSFET isolating transistor 24 and the output terminal 14. The source and drain of the third MOSFET compensating transistor 28 are electrically shorted together. A clock marked "clk2B" is applied to the gate terminal 30 of the third MOSFET compensating transistor 28 to cause it to controllably assume its "on" and its "off" conditions. A dummy capacitor 32 marked "C dummy" is electrically connected in parallel to the load 18 in the DC input signal path between the drain of the switching MOSFET 20 and the source of the isolating MOSFET 24. A fourth MOSFET sampling transistor generally designated 34 is electrically connected in series in the AC input signal path with its source terminal connected to the AC input terminal 16 and with its drain electrically connected to the sampled output terminal 14. A clock marked "clk3" is connected to gate terminal 36 of the fourth MOSFET sampling transistor 34 to control its "on" and "off" conditions. In one preferred embodiment, the capacitors 18, 32 are selected to have an equal value of capacitance. In one preferred embodiment, the equivalent capacitance exhibited by the electrically-shorted source and drain terminals of the third MOSFET compensating transistor 28 is selected to match the gate to drain capacitance of the second MOSFET isolating transistor 24. As will readily be appreciated by those skilled in the art, if "Cp" represents the magnitude of the gate to drain parasitic (offset) capacitance of the second MOSFET isolating transistor 24, by fabricating the third MOSFET compensating transistor 28 to have a gate to source parasitic capacitance of "Cp/2" and a gate to drain parasitic capacitance of "Cp/2", as by scaling the geometry of the junctions of the third MOSFET compensating transistor by the reciprocal factor of two, the equivalent capacitance "Cp" is seen across the shorted source to drain terminals thereof and one half the channel charge of the second MOSFET isolating is exhibited thereby.

Figure 1B:
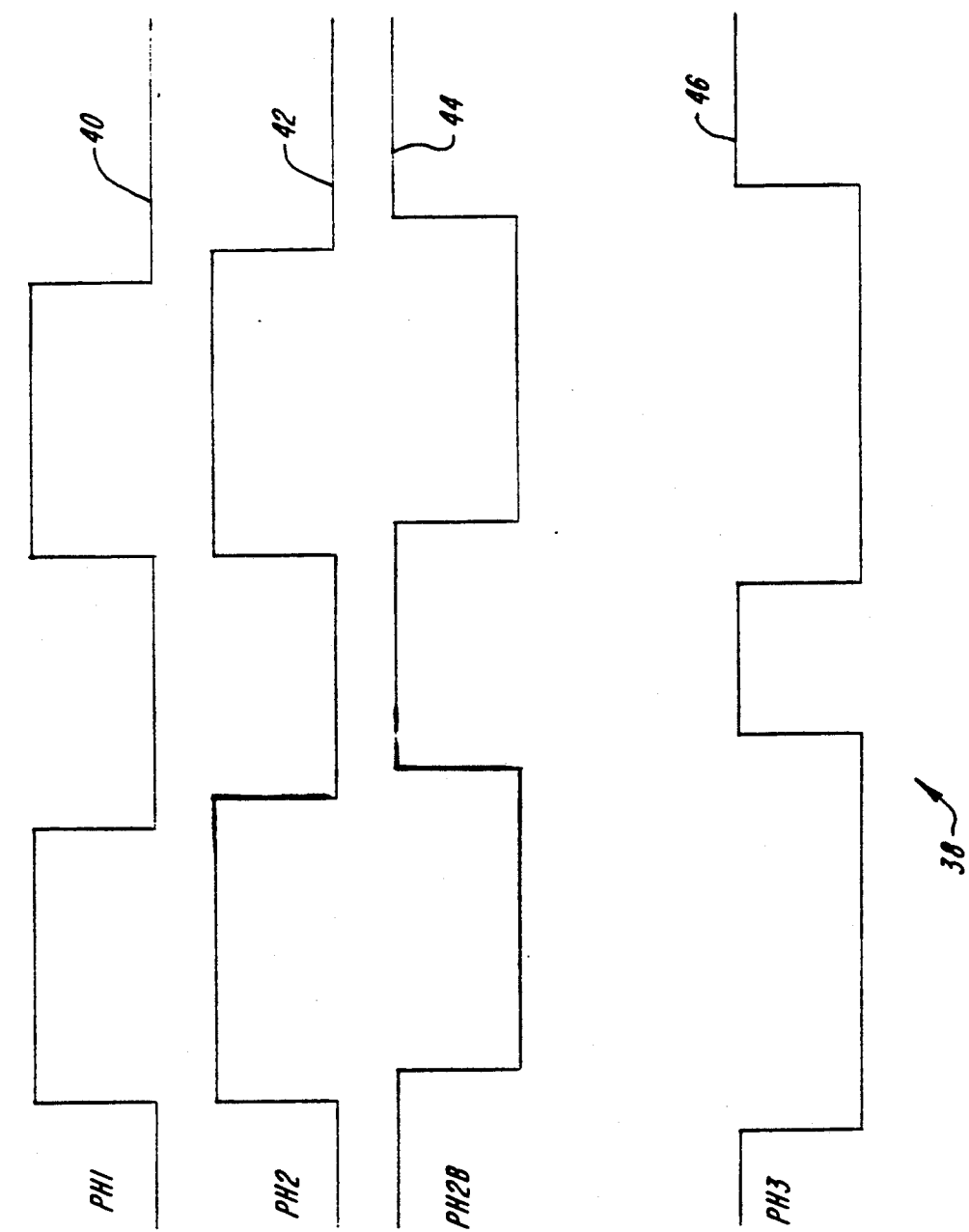

In operation, and referring now to FIG. 1A, as well as to FIG. 1B where numeral 38 generally designates four timing clock signals designated "ph1", "ph2", "ph2B" and "ph3" that correspond respectively to the clock signals "clk1", "clk2", "clk2B" and "clk3" of FIG. 1A, the first MOSFET switching transistor 20 and the second MOSFET isolating transistor 24 are cyclically caused to be in their "on" conditions substantially simultaneously as shown by the phase "1" and phase "2" clock signals 40, 42 respectively. With the switching and isolating MOSFETS 20, 24 substantially simultaneously "on" together, the reference DC input voltage applied to the terminal 12 is electrically coupled to the loads 18, 32 cycle-to-cycle. As will readily be appreciated by those skilled in the art, after but a few cycles, the voltage on the dummy capacitor 32 tends to stabilize at and around the value of the voltage of the reference DC input signal. Subsequent sampling of the reference DC input voltage thereby will be read onto the load capacitor 18 as if the dummy capacitor 32 were electrically transparent to the DC input signal along the DC input signal path.

The trailing edge of the phase "2" clock 42 trails the trailing edge of the phase "1" clock 40 so that the isolating MOSFET 24 remains in its "on" condition while the switching MOSFET 20 is caused to assume its "off" condition. Charge feedthrough error produced by the switching MOSFET 20 in the forward direction along the DC input signal path thereby substantially equally splits between the capacitors 18 and 32. At the trailing edge of the phase "2" clock 42 cycle-to-cycle, the switching MOSFET 20 is in its "off" condition. The charge feedthrough error of the isolating MOSFET 24 as it is switched to its "off" condition cyclically, composed of unwanted currents attributable to both parasitic gate to source and gate to drain capacitance as well as to source to drain channel charge, is fed forward along the DC input signal path to the load capacitor 18 and backward therealong to the dummy capacitor 32, in such manner that the charge feedthrough error splits substantially equally therebetween.

The leading edge of the phase "2B" clock signal 44 trails the trailing edge of the phase "2" clock signal 42 cycle-to-cycle by an interval sufficient to insure that the isolating MOSFET 24 is completely in its "off" condition before the compensating MOSFET 28 is caused to assume its "on" condition. As it is caused to assume its "on" condition, the compensating MOSFET 28 produces a current equal but opposite to the unwanted currents produced by the isolating MOSFET 24, including currents attributable to both parasitic gate to drain capacitance and to parasitic source to drain capacitance as well as to channel charge, that exactly compensate the load 18 for the effect of the unwanted current feed forward thereto as produced by the isolating MOSFET 24 assuming its "off" condition cycle-to-cycle. In one preferred embodiment, the third MOSFET compensating transistor is selected to produce a compensating current equal in magnitude to the charge feedthrough error that the second MOSFET isolating transistor induces in the load 18, namely, a compensating current equal in magnitude to the unwanted currents attributable to one half the channel charge and attributable to the gate to drain parasitic capacitance thereof. Since the charge feedthrough error fed forward by the switching MOSFET 20 is divided equally between the dummy load 32 and the load 18, and because the compensating MOSFET 28 precisely compensates the load 18 for the charge feedthrough error of the isolating MOSFET 24, the voltage caused to be sampled at the load capacitor 18 from the voltage applied to the DC input terminal 12 is at least more accurate by a factor of two than for the heretofore known charge feedthrough error compensation technique.

As shown by waveform 46, the leading edge of the phase "3" clock trails the leading edge of the phase "2B" clock signal 44 and the trailing edge thereof leads the leading edge of the phase "1" clock signal 40, so that the AC signal applied to the AC input terminal 16 is electrically connected to the sample output terminal 14 if and only if the isolating MOSFET 24 is already well into its "off" condition. The input analog signal applied to the terminal 16 thereby sees only the load capacitor 18 cycle-to-cycle, in a manner that is transparent to the dummy load 32.

Figure 2:
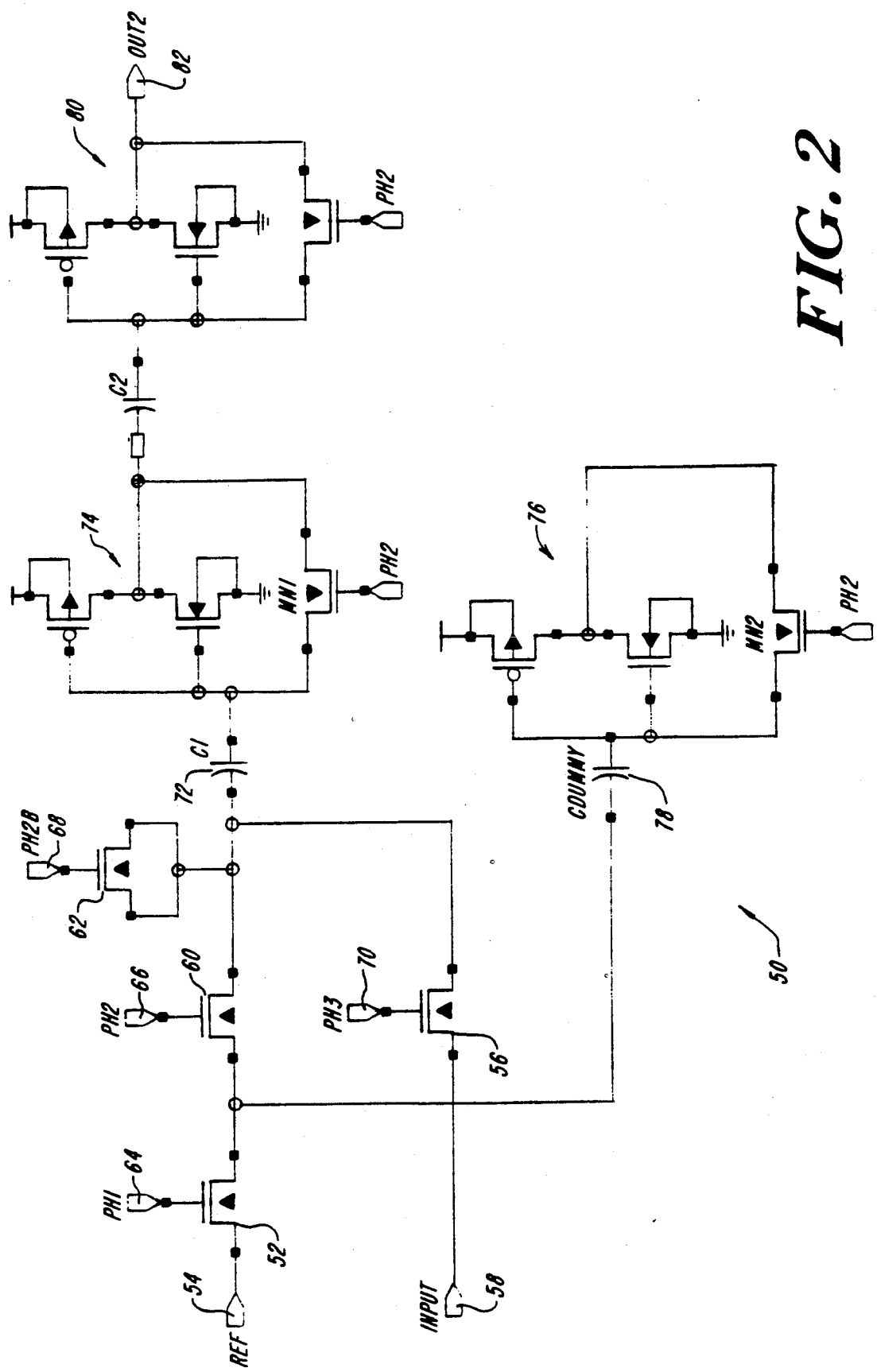
FIG. 2 is a schematic diagram of an exemplary autozeroed CMOS comparator embodying the high-accuracy MOSFET-switched sampling circuit in accord with the present invention.

Referring now to FIG. 2, generally designated at 50 is a schematic diagram illustrating an auto-zeroed CMOS comparator embodying the high-accuracy MOSFET-switched sampling circuit in accord with the present invention. Although an auto-zeroed CMOS comparator 50 is illustrated, it will be appreciated that the present invention has a wide range of application, and is not limited to the exemplary auto-zeroed CMOS comparator 50 of the FIG. 2 embodiment of the present invention.

The auto-zeroed CMOS comparator 50 includes a first switching MOSFET 52 in the DC input signal path that is connected to a terminal 54 at which a DC reference signal marked "ref" is applied, and a second switching MOSFET 56 in the AC input signal path connected with its source to a terminal 58 marked "input" at which an AC input signal is applied. An isolating MOSFET 60 is connected in the DC input signal path with its source serially connected to the drain of the switching MOSFET 52, and a compensating MOSFET 62, the source and the drain terminals of which are short-circuited as described above in connection with the description of the FIG. 1A embodiment, is connected in the DC input signal path to the drain of the isolating MOSFET 60. The first switching MOSFET 52, the isolating MOSFET 60 and the compensating MOSFET 62 in the DC input signal path are respectively switched between their "on" and their "off" conditions by a phase "1" clocking signal marked "PH1" applied to a terminal 64 of the MOSFET 52, by a phase "2" clocking signal marked "PH2" applied to the gate terminal 66 of the MOSFET 60 and by a phase "2B" clocking signal marked "PH2B" applied to the gate terminal 68 of the MOSFET 62 cycle-to-cycle. The second switching transistor 56 in the AC input signal path is switched between its "on" and its "off" conditions by a phase "3" clocking signal marked "PH3" applied to the gate terminal 70 of the MOSFET 56. The phase "1", phase "2", phase "2B" and phase "3" clocking signals are the same in relative phase as the correspondingly marked waveforms described above in connection with the description of FIG. 1B.

The load seen by the AC input signal is constituted by a capacitor 72 marked "Cl" in series with a bank of active MOSFETS generally designated 74 that are coupled in a well-known manner to provide an inverter. In accord with the present invention, the identical active load including a bank of dummy MOSFETS generally designated 76 and a dummy capacitor 78 marked "C dummy" is connected in the DC input signal path in electrically parallel relation with the load having the bank of MOSFETS 74 and load capacitor 72. In one preferred embodiment, the capacitance of the capacitor 78 is selected to be equal to the capacitance of the capacitor 72, and corresponding MOSFETS of the bank of MOSFETS 76 that constitute the analog inverter 76 are matched to the MOSFETS of the bank of MOSFETS that constitute the analog inverter 74.

The MOSFETS marked "MN1" and "MN2" of the analog inverter's 74, 76 have their gate terminals connected to the phase "2" clocking signal. As will readily be appreciated by those skilled in the art, the phase "2"

clocking signals control the "on" and "off" conditions of the MOSFETS MN1, MN2 of the analog inverters 74, 76 in such a way that when the MOSFETS MN1, MN2 thereof are in their "on" condition, the corresponding analog inverters 74, 76 are held at their metastable point. By the switching transistor 56 the input AC signal is capacitively coupled to the analog inverter 74 by the phase "3" clocking signal at times corresponding to the MOSFET MN1 of the analog inverter 74 being switched to its "off" condition by the phase "2" clocking signal. As the input analog signal moves above and below the DC reference, the analog inverter 74 moves above and below its logic threshold defined by its metastable point. The output thereof gives the logical comparison of the relative magnitudes of the reference DC input signal and the magnitude of the input AC signal as it is driven either above or below the metastable point that defines its logical threshold.

Downstream of the analog inverter 74 is a second gain stage generally designated 80. The second gain stage 80 is constructed of a bank of MOSFETS that function as an analog inverter. The output of the second gain stage is applied via a terminal 82 marked "out 2" to a latch, not shown.

In operation, the switching MOSFET 52 and the isolating MOSFET 60 are cyclically held in their "on" conditions and the DC input signal applied to the terminal 54 is coupled along the DC input signal path in parallel to the active loads 72, 74; 76, 78. The phase "3" clocking signal keeps the second switching MOSFET 56 in its "off" condition whenever the phase "1" and phase 2 clocking signals hold the MOSFETS 52, 60 in their "on" conditions. The phase "1" and the phase "2" clocking signals are so phased that the trailing edge of the phase "1" clocking signal leads the trailing edge of the phase "2" clocking signal by a time interval selected to enable the first switching MOSFET 52 to be completely in its "off" condition before the isolating MOSFET 60 is in its "off" condition. The charge feedthrough error in the forward direction produced by the parasitic capacitance of the first switching MOSFET 52 thereby is equally split between the active loads 72, 74; 76, 78 and is stored on the capacitors 72 and 78 thereof. The phase "2" clocking signal and the phase "2B" clocking signal are in phase opposition, and the trailing edge of the phase "2" clocking signal is selected to lead the leading edge of the phase "2B" clocking signal by a time interval sufficient to insure that the isolating MOSFET 60 is completely in its "off" condition before the compensating MOSFET 62 is in its "on" condition. The charge feedthrough error produced by the isolating MOSFET 60 as it is switched to its "off" condition splits equally between the active loads 72, 74; 76, 78 and is stored in equal parts on the capacitors 72, 78 thereof. In the preferred embodiment, the unwanted currents associated with the gate to source parasitic capacitance and substantially one half of the current associated with the channel charge are stored in the dummy capacitor 78 and the unwanted currents associated with the gate to drain parasitic capacitance and substantially the other half of the currents associated with the channel charge are stored on the capacitor 72. The compensating MOSFET 62, which in the preferred embodiment is selected to have a parasitic capacitance and channel charge equal to that of the gate to drain parasitic capacitance and substantially one-half the channel charge of the isolating MOSFET 60, thereby completely cancels the error on the capacitor 72 produced by the isolating MOSFET's 60 unwanted current as it is turned to its "off" condition by the phase "2" clocking signal. The leading edge of the phase "3" clocking signal trails the trailing edge of the phase "2" clocking signal to insure that the input AC signal is only seen by the load 72, 74, but not by the dummy load 76, 78. The phase "2" clocking signal of the isolating MOSFET 60 keeps the isolating MOSFET 60 in its "off" condition at times when the phase "3" clocking signal turns the sampling MOSFET 56 to its "on" condition and thereby isolates the AC input signal path from the dummy load 76, 78.

Once the dummy capacitor 78 is initially charged to the reference voltage applied thereto along the DC input signal path, it does not require any further significant charging current. This produces the effect that the DC input signal only sees the capacitor 72, effectively making the dummy capacitor 78 transparent to the DC input signal. The isolating MOSFET 60 isolates the AC input signal from the dummy capacitor 78 of the dummy active load 76. The AC input signal thereby only sees the load 72, 74, but is transparent to the load 76, 78, and no penalty is paid by the presence of the dummy load 76, 78.

Many modifications of the presently disclosed invention will become apparent to those skilled in the art without departing from the inventive concept. One such modification is a ratio between the loads of the actual and dummy loads that is other than a one to one ratio. A further modification is to select the parasitic capacitance of the compensating MOSFET to produce compensating currents that compensate not only the isolating MOSFET, but the first switching MOSFET as well. Other modifications will readily become apparent to those skilled in the art having benefited by the instant disclosure.

What is claimed is:

1. A circuit compensating charge feedthrough error in the form of unwanted currents produced as a switching MOSFET in a DC input signal path defined between a DC input terminal and a load is cyclically switched to its "off" condition from its "on" condition in order to enable a DC input signal applied to the DC input terminal to be sampled onto the load, which unwanted currents would otherwise corrupt the accuracy with which an AC input signal is able to be sampled onto the same load along an AC input signal path defined between an AC input signal terminal and the same load, comprising:

first means in the DC input signal path for feeding a preselected portion less than unity of the feedforward charge feedthrough error of the switching MOSFET to the load;

second means including an isolating MOSFET in the DC input signal path cooperative with the first means for electrically isolating the first means from the AC input signal path, the isolating MOSFET producing feedforward charge feedthrough error to the load as it is switched to its "off" condition from its "on" condition; and third means cooperative with the first and second means for exactly compensating the load for the feedforward charge feedthrough error of the isolating MOSFET of the second means.

2. The invention of claim 1, wherein said first means includes a dummy load in the DC input signal path that is in electrically parallel relation with the load.

3. The invention of claim 2, wherein said dummy load is electrically equivalent to the load, and said preselected portion is a half portion.

4. The invention of claim 2, wherein the isolating MOSFET of the second means is provided in the DC input signal path in electrically serial relation between the dummy load and the load, where a switching MOSFET is positioned in the AC input signal path, and wherein the second means includes means for switching the isolating MOSFET fully to the "off" condition thereof before the switching MOSFET in the AC input signal path is switched to the "on" condition thereof.

5. The invention of claim 1, wherein said isolating MOSFET feedforward charge feedthrough error is in form of currents attributable to gate to drain parasitic capacitance as well to source to drain channel charge, and wherein the third means includes a compensating MOSFET having a parasitic capacitance having a preselected value that is selected to bear a predetermined first relation to the value of the gate to drain parasitic capacitance of the isolating MOSFET of the second means and a predetermined second relation to the source to drain channel charge thereof.

6. The invention of claim 5, wherein said first predetermined relation is to substantially match the parasitic capacitance of the gate to drain parasitic capacitance of the isolating MOSFET and said predetermined second relation is to substantially match one half of the source to drain channel charge of the isolating MOSFET 7. The invention of claim 2, wherein said load and said dummy load are active loads.

8. The invention of claim 7, wherein said active loads include a bank of MOSFETS connected as an analog inverter.

9. A method providing high-accuracy sampling of a DC signal and an AC signal to a common load using MOSFET switching transistors respectively in a DC input signal path from the DC signal to the load as well as in an AC input signal path from the AC signal to the same load, comprising:
   sampling the DC input signal using the MOSFET switching transistor in the DC input signal path, allowing the DC input signal to see a dummy load and the load so that feedforward charge feedthrough error produced as the MOSFET switching transistor in the DC input signal path is caused to assume its "off" condition is split between the dummy load and the load in a predetermined manner; and
   sampling the AC input signal onto the common load using the MOSFET switching transistor in the AC input signal path, isolating the AC input signal from the dummy load.

10. The invention of claim 9, wherein said isolating step includes the step of insuring that a MOSFET isolating transistor positioned in electrically serial relation between the dummy load and the AC input signal is in its "off" condition before allowing sampling of the AC input signal onto the common load, and further including the step of compensating any feedforward charge feedfeedthrough error produced as unwanted currents as the isolating MOSFET is caused to assume its "off" condition by actuating a compensating MOSFET positioned in the DC input signal path in electrical series relation with the isolating MOSFET in phase opposition to the isolating MOSFET.

11. The invention of claim 10, wherein said feedforward charge feedthrough error produced by the isolating MOSFET is a current attributable to gate to drain parasitic capacitance and attributable to source to drain channel charge, and wherein the compensating current produced by the phase-opposed compensating MOSFET is attributable to a parasitic capacitance that bears a predetermined first relation to the gate to drain parasitic capacitance of the isolating MOSFET and a source to drain channel charge that bears a predetermined second relation to the source to drain channel charge of the isolating MOSFET.

12. The invention of claim 11, wherein the first predetermined relation is a relation of equality and the second predetermined relation is a relation by a factor of one half.

13. The invention of claim 1, wherein the dummy load and the load are both active loads.

14. The invention of claim 1, wherein the dummy load and the load have substantially equal electrical characteristics.

15. A high-accuracy MOSFET-switched sampling circuit alternatively sampling a DC input signal and an AC input signal onto a common load by controllably switched MOSFET switching transistors respectively positioned in a DC input signal path defined between the DC input signal and the load and in an AC input signal path defined between the AC input signal and the same load, comprising:
   a dummy load; and
   means coupled to the dummy load for allowing the DC input signal to see the dummy load and the load so that charge feedthrough error produced as the MOSFET switching transistor in the DC input signal path is caused to assume it "off" condition is split between the dummy load and the load in a predetermined manner while sampling the DC signal onto the load using the MOSFET switching transistor in the DC input signal path.

16. The invention of claim 15, further including means for isolating the AC input signal from the dummy load while sampling the AC input signal onto the common load using the MOSFET switching transistor in the AC input signal path.

17. The invention of claim 16, wherein said isolating means includes an isolating MOSFET positioned in electrical series relation between the dummy load and the AC input signal along the AC input signal path.

18. The invention of claim 17, further including means for compensating the isolating MOSFET of the isolating means for charge feedthrough error produced as unwanted currents whenever the isolating MOSFET of the isolating means is caused to assume its "off" condition.

19. The invention of claim 18, wherein the charge feedthrough error of the isolating MOSFET is attributable to gate to drain parasitic capacitance, and is attributable to source to drain channel charge, and wherein the compensating means includes a compensating MOSFET switched in phase-opposition to the isolating MOSFET that has a parasitic capacitance selected to produce a current attributable to its parasitic capacitance that at least compensates the charge feedthrough error produced by the isolating MOSFET, as well as to exhibit a source to drain channel charge that at least compensates the source to drain channel charge of the isolating MOSFET.

20. The invention of claim 15, wherein said predetermined manner is an equal splitting therebetween.

* * * * *